US005747829A

United States Patent [19]
Sakurai et al.

[11] Patent Number: 5,747,829
[45] Date of Patent: May 5, 1998

[54] DIELECTRIC ISOLATED HIGH VOLTAGE SEMICONDUCTOR DEVICE

[75] Inventors: Naoki Sakurai; Yoshitaka Sugawara, both of Hitachi, Japan

[73] Assignee: Hitachi, Ltd., Tokyo, Japan

[21] Appl. No.: 895,086

[22] Filed: Jul. 15, 1997

Related U.S. Application Data

[60] Continuation of Ser. No. 451,265, May 30, 1995, abandoned, which is a division of Ser. No. 147,314, Nov. 5, 1993, Pat. No. 5,463,243.

[30] Foreign Application Priority Data

Nov. 6, 1992 [JP] Japan .................. 4-296786

[51] Int. Cl.$^6$ .............. H01L 29/76; H01L 31/036; H01L 31/112
[52] U.S. Cl. .............................. 257/66; 257/349
[58] Field of Search .................. 357/66, 349, 352, 357/353, 354

[56] References Cited

U.S. PATENT DOCUMENTS

| | | | |
|---|---|---|---|
| 3,990,102 | 11/1976 | Okuhara et al. | 357/49 |
| 4,242,697 | 12/1980 | Berthold et al. | 257/524 |
| 4,287,526 | 9/1981 | Sakuma . | |
| 5,040,043 | 8/1991 | Ohno et al. | 257/506 |

FOREIGN PATENT DOCUMENTS

| | | | |
|---|---|---|---|
| A-0213299 | 3/1987 | European Pat. Off. . | |
| 2451861 | 5/1975 | Germany . | |
| 4221039 | 1/1993 | Germany | 257/507 |
| A-56-142649 | 11/1981 | Japan . | |
| A-57-180148 | 11/1982 | Japan . | |
| 58-171856 | 10/1983 | Japan | 257/507 |
| WO-A-8001968 | 9/1980 | WIPO . | |

OTHER PUBLICATIONS

Patent Abstracts of Japan, vol. 012, No. 320.
Patent Abstracts of Japan, vol. 009, No. 240.

*Primary Examiner*—Ngânn V. Ngô
*Attorney, Agent, or Firm*—Antonelli, Terry, Stout, & Kraus, LLP

[57] ABSTRACT

A dielectric isolated high voltage semiconductor device having an arrangement for extending a depletion layer of a main junction beyond an insulating layer containing an island to a semiconductor supporter by applying the same reverse biasing voltage to the supporter and the islands. That is, in the structure, an electrode is provided at the back surface of the supporter and connected to a main electrode of the selected island. The above-mentioned main junction is the pn junction to which the reverse biasing voltage for securing the withstand voltage of the semiconductor device is applied.

9 Claims, 11 Drawing Sheets

DIELECTRIC ISOLATED HIGH VOLTAGE SEMICONDUCTOR DEVICE

This application is a continuation of application Ser. No. 08/451,265, filed on May 30, 1995, now abandoned, which is a divisional of application Ser. No. 08/147,314, filed Nov. 5, 1993, now U.S. Pat. No. 5,463,243.

BACKGROUND OF THE INVENTION

(1) Field of the Invention

The present invention relates to a semiconductor integrated circuit apparatus using a dielectric separation substrate, and more particularly to a semiconductor integrated circuit apparatus having high withstand voltage and high integration density.

(2) Description of the Prior Art

A dielectric separation substrate having a high withstand voltage and capable of downsizing the region for separating elements is presently used as a substrate for semiconductor integrated circuits dealing with high voltages, instead of a pn separation method. An existing dielectric separation substrate has the constitution wherein semiconductor islands such as n-type semiconductor islands, each of which are surrounded by oxide films ($SiO_2$) are embedded together in one side of a supporter. The supporter includes poly-silicon and high impurity concentration layers (n+) formed along with the oxide film at the places adjoining other islands for suppressing the elongation of a depletion layer. This existing dielectric separation substrate has the following problems.

The first problem is one related to product processing. The substrate producing process comprises the steps of;

{1} forming V character form grooves on one side of a n-type semiconductor substrate by the anisotropic etching using a mixture of potassium hydroxide (KOH), water and N-propanol, {2} injecting impurities to make the n+ layers on the faces of the grooves and the side of the semiconductor substrate, {3} forming oxide films on the faces of the grooves and one side of the semiconductor substrate, {4} accumulating poly-silicon on the oxide films, and {5} chipping down the other side of the semiconductor substrate to the bottom of the grooves and forming the semiconductor islands separated by the oxide films.

The above-mentioned producing process of the dielectric separation substrate has the first problem that the producing process is not easy since it is necessary to form a thick poly-silicon layer. The second problem is that the element integration density decreases in accordance with an increase of the withstand voltage. It is needed to enlarge the region of the depletion layer for increasing the withstand voltage, which requires the formation of deep semiconductor islands. Since the side face of the semiconductor island makes an angle of 55° to its exposed face due to the above-mentioned anisotropic etching, the area of the exposed face becomes larger and the integrated density decreases as the depth of the semiconductor island increases.

One dielectric separation substrate which solves the first problem is described in a Japan Patent Laid open 292934/1986. The dielectric separation substrate has the constitution wherein the semiconductor islands are made more shallow, the poly-silicon layer is formed a little thicker so that it can bury the grooves and a semiconductor substrate having a oxide film on its surface is formed on the poly-silicon layer. By this constitution, the producing process becomes easier since accumulation of the deep poly-silicon is not needed. However, this dielectric separation substrate has the defect that the integration density considerably decreases in accordance with an increase of the withstand voltage, which is explained by FIG. 18.

In FIG. 18, a semiconductor island 100, a poly-silicon layer 101 in which the semiconductor island 100 is buried and supported by a silicon oxide film 102, and a semiconductor substrate 103 adhered to the poly-silicon layer 101 with a silicon oxide film 104 between, etc. are shown. In the case of a diode, the semiconductor island 100 includes a n− type region 100a, and a p+ type region 100b and a n+ type region 100c which are formed separated from each other at the exposed face of the n− type region. An anode electrode 105 and a cathode electrode 106 are connected by an ohmic contact to the p+ type region 100b and the n+ type region 100c, respectively. In the constitution, when the reverse bias voltage is applied to the pn junction formed between the p+ region 100b and the n− type region 100a by the anode electrode 105 and the cathode electrode 106, a depletion layer is considerably extended to the n− type region side. Since the depth of the semiconductor island 100 is shallow, the depletion layer can not be extended to the perpendicular direction but instead must extend to the lateral direction. In the case shown, the field strength and the equipotential lines are as shown in the figure. An unusually high peak of the field strength appears in the vicinity of the boundary between the n− type region 100a and the n+ type region 100c where the extension of the depletion layer is stopped. Increasing the interval between the p+ type region 100b and the n+ type region 100c can suppress the peak, however, this undesirably makes the semiconductor larger and reduces the integration density.

As mentioned above, by virtue of the semiconductor integrated circuit apparatus using the existing dielectric separation substrate, it is impossible to realize a high withstand voltage and a high integration density at the same time since increasing the withstand voltage impedes the high integration density and vice versa. The increasing trend of the commercial power voltage from 100 V to 200 V renders it impossible to avoid the increase of the withstand voltage in the field of the semiconductor integrated circuits using a dielectric separation substrate. The decrease of the integration density of the semiconductor integrated circuit apparatus means the functional deterioration of one-chip circuits and brings about the loss of the largest merit in using an integrated circuit apparatus for an electric circuit.

SUMMARY OF THE INVENTION

(1) Objects of the Invention

The present invention has been achieved in consideration of the above-mentioned problems and is aimed at providing a new semiconductor integrated circuit using a dielectric separation substrate for simultaneously realizing both high withstand voltage and high integration density.

(2) Method Solving the Problems

A first feature of the present invention is that a semiconductor integrated circuit apparatus of the present invention has the constitution comprising a means for extending a depletion layer of a main junction beyond an insulating layer, sandwiched between a supporter and semiconductor islands, to the supporter by applying the bias voltage to the supporter and the semiconductor islands. That is, with this arrangement, an electrode is provided at the surface of the supporter and connected to a main electrode of the selected island. The above-mentioned main junction is the pn junction to which the reverse bias voltage for securing the withstand voltage of the semiconductor element is applied.

A second feature of the present invention is that the impurity density and the thickness of the region between the bottom part of the semiconductor island and the circuit element regions is set so that the region between the bottom part of the semiconductor island and the circuit element regions is fully depleted by a lower voltage than the voltage at which avalanche breakdown occurs in a semiconductor island supported by the supporter with a insulating film between. That is, the distance between the bottom part of the semiconductor island and the main junction of a selected semiconductor island supported by the supporter with the insulating film between is set less than $\sqrt{2 \times \epsilon_{Si} \times V/(q \times Nd)}$ ($\epsilon_{Si}$: dielectric constant of Si, q: elementary charge, Nd: impurity concentration of the semiconductor island) when the withstand voltage of the circuit element is V volts. The supporter used for the semiconductor integrated circuit apparatus of the present invention is made by such material or layer composition as the laminate piled up with the first semiconductor layer of a first conductivity type and the second semiconductor layer of the first conductivity type adjoining the first semiconductor, having higher impurity concentration than the first semiconductor, the laminate having a insulating material layer sandwiched between the first semiconductor layer and the second semiconductor layer, the transformed laminate of the above-mentioned laminates and so forth. And silicon is used as the first semiconductor and poly-silicon or mono-crystal silicon is used as the second semiconductor.

Therefore, the present invention has the following effects:

{1} It is possible to reduce the area of a semiconductor island and attain high integration density due to the decrease of the field strength at the surface of the semiconductor island.

{2} It is possible to reduce the area of a semiconductor island and attain high integration density due to the considerable decrease of the depth of a semiconductor island by the extension of the depletion layer beyond the insulating film into the supporter.

{3} It is possible to decrease the field strength at the surface of the semiconductor island and attain the high withstand voltage by the extension of the depletion layer beyond the insulating film into the supporter.

{4} It is possible to provide a simplified production process of a dielectric separation substrate due to the considerable decrease of the depth of the semiconductor islands.

DETAILED DESCRIPTION OF THE EMBODIMENTS

Figure 1:
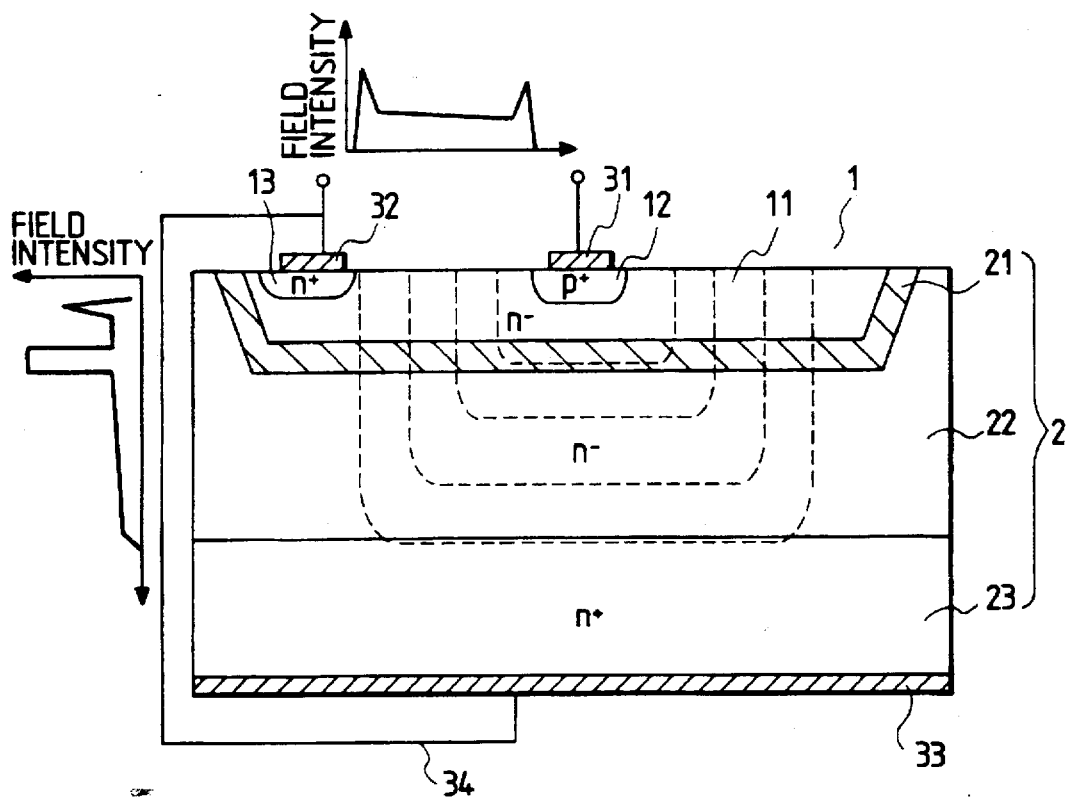
FIG. 1 is a sectional outline drawing showing the first embodiment of the semiconductor integrated circuit apparatus of the present invention.

Hereinafter, details of the present invention will be explained based on embodiments referring to in the drawings.

(Embodiment 1)

FIG. 1 is a sectional outline drawing showing embodiment 1 of the semiconductor integrated circuit (abbreviated to SIC) apparatus by the present invention. As shown in FIG. 1, the SIC apparatus comprises a semiconductor island (abbreviated to merely island) 1 and a supporter 2 including a poly-silicon layer 22 supporting the island 1 with a silicon oxide film between, and an n type semiconductor substrate 23 having higher impurity concentration than the poly-silicon layer 22 adjoining to the face opposite to the exposed surface of the island 1 buried in the poly-silicon 22. And the island 1 comprises the first n type layer 11 extending inside from the exposed surface, the second p type layer 12 of higher impurity concentration than the first n type layer 11 extending inside from the surface of the first layer 11 and forming the pn junction J with the first layer 11, and the third n type layer 13 of higher impurity concentration than the first layer 11 extending inside at a place apart from the second layer 12 of the surface of the first layer 11. And reference numeral 31 designates the first main electrode ohmicly contacted to the second layer 13, 32 the second main electrode ohmicly contacted to the third layer 13, and 33 a auxiliary electrode ohmicly contacted to a semiconductor substrate 23 which is connected to the second main electrode 32 by a lead 34 and kept at the same potential as the second main electrode 32. In the abovementioned constitution, by applying a voltage having such polarity as reversely biases the pn junction J (where the second main electrode 32 has the positive potential and the first main electrode 31 the negative potential) to the first main electrode 31 and the second main electrode 32, the depletion layer is formed around the pn junction J. Since the depletion layer mostly extends to the side of the first layer 11 of low impurity concentration and the auxiliary electrode 33 has the same potential as the second electrode 32, the perpendicular extension of the depletion layer becomes larger and the depletion layer extending to the side of the first layer 11 goes beyond the silicon layer 21 into the poly-silicon layer 22 as shown by the dotted lines in the figure. Thereby, the lateral extension of the depletion layer at the surface of the island 1 is suppressed and the peak of the field strength at the vicinity of the boundary of the third layer 13 and the first layer 11 remarkably decreases. The reason why the lateral extension of the depletion layer is suppressed is because the quantity of electric charge swept out by the extension of the depletion layer is constant if the pn junction area and its potential are kept constant and the lateral extension of the depletion layer at the surface of the island 1 is reduced in inverse proportion to the perpendicular extension. By the above-mentioned operations of the SIC apparatus of the present invention, the following effects are expected:

{1} It is possible to reduce the distance between the third layer 13 and the first layer 11 and consequently the area of an island 1, and to attain the high integration density due to the decrease of the field strength at the surface of the island 1.

{2} It is possible to reduce the area of a island 1 and to attain the high integration density due to the considerable decrease of the depth of the first layer 11 by the extension of the depletion layer beyond the silicon oxide film 21 into the poly-silicon layer 22.

{3} It is possible to decrease the field strength at the surface of the island 1 and to attain the desired high withstand voltage by the extension of the depletion layer beyond the silicon oxide film 21 into the poly-silicon layer 22.

With the arrangement of the present invention, the impurity concentration of the first layer 11 and the thickness of the region between the bottom part of the second layer 12 and the silicon oxide film 21 are set so that the region between the bottom part of the second layer 12 and the silicon oxide film 21 is fully depleted by a lower voltage than that at which the avalanche breakdown occurs in the first layer 11. That is, if the voltage by which the avalanche breakdown occurs in the first layer 11 is Vb, the impurity concentration of the first layer 11 is Nd, and the perpendicular distance between the bottom of the second layer 12 and the silicon oxide film 21 is L, then the values of Vb, Nd and L are determined so that they satisfy Eq. (1).

$$L < \sqrt{2 \times \epsilon_{si} \times Vb/(q \times Nd)} \qquad (1)$$

Since Vb, Nd and L are determined so as to satisfy Eq. (1), the region between the bottom part of the second layer 12 and the silicon oxide film 21 is fully depleted by a lower voltage than that at which the avalanche breakdown occurs in the first layer 11, and the depletion layer extends beyond the silicon oxide film 21 into the poly-silicon layer 22. And since the applied voltage is divided, and each of the divided voltages is applied to the first layer 11, the silicon oxide film 21 and the poly-silicon layer 22, respectively, the voltage applied to the first layer 11 is lower than the voltage applied to the whole apparatus. Therefore, the increase of the withstand voltage can be realized in spite of the thinner first layer 11. Further, it is preferable that the depletion layer extending in the poly-silicon layer 22 reaches the semiconductor substrate 23. Thereby, the ratio of the applied voltage that the poly-silicon layer 22 shares becomes larger and the withstand voltage is further improved. Now, the potential E1 applied to the first layer 11 is expressed by the following equations;

$$E1 = C2/(C1+C2) \times V/L \qquad (2)$$

C2=(capacitance of silicon oxide film per unit area)+(capacitance of poly-silicon layer per unit area) $=1/(t_{ox}/\epsilon_0 X + L_{poly}/\epsilon_{si})$ (3)

C1=(capacitance of the first layer)=$\epsilon_{si}/L$ (4)

where $t_{ox}$ is the film capacitance thickness of the silicon oxide film 21, $L_{poly}$ is the thickness of the polysilicon layer 22, $\epsilon_{ox}$ is the dielectric constant of the silicon oxide film 21, and V is the applied voltage.

In the existing SIC apparatus, the thickness of the first layer is 50 μm and the withstand voltage is 700 V. Then, the potential of the avalanche breakdown becomes 14 V/μm. By using the equation of Emax, and letting $t_{ox}$=2 μm and $L_{poly}$=45 μm, the thickness of the first layer by the present invention is calculated as 4.3 μm from Eq. (2) Eq. (4) and reduced to 1/10 of the thickness of the corresponding layer in conventional devices. Since the silicon is scraped with the angle of 55 degrees by using a KOH solution as the etching fluid, the surface area of the separation region becomes larger than by vertical etching. In the present invention, the enlargement by etching using a KOH solution is not so much due to the thin thickness of the mono-crystal region in the present invention. Therefore, the thickness of the separation region is reduced from 49 μm (existing value: 50 μm/ tan 55°) to 4 μm (value by the present invention). It is made known by Eq. (2)–Eq. (4) that the same withstand voltage can be obtained even if the thickness of the first layer 11 is reduced, as the thickness of the poly-silicon increases. Therefore, it is desirable to increase the thickness of the poly-silicon layer within the limits of production time and cost. And, from the relation of 14 V/μm between the withstand voltage and the thickness of the first layer 11, if the withstand voltage is 700 V, then the thickness of the first layer 11 in conventional devices is calculated as 50(=700× 1/14) μm which is larger than that of the present invention SIC apparatus. Since the supporter of the semiconductor substrate 23 has higher impurity concentration than the poly-silicon layer 22, the depletion layer extending from the pn junction is stopped at the semiconductor substrate 23, which prevent the depletion layers extending from the adjoining islands from being connected and interfering with each other in the semiconductor substrate 23. Also, the high density impurity in the semiconductor substrate 23 reduces the contact resistance of the auxiliary electrode 33 thereto. Further, the voltage for fully depleting the first layer 11 between the bottom of the second layer 12 and the silicon oxide film 21 is desirably set to the rated voltage. Then, since the avalanche voltage is higher than the rated voltage, higher integration density can be realized by making the thickness of the first layer even thinner. Now, it is needed to determine the distance L23 between the second layer 12 and the third layer 13 so that the avalanche voltage is higher than the rated voltage, since the whole potential between the second layer 12 and the third layer 13 is applied to the first layer 11. That is, if the rated voltage is designated by Vs, $L_{23}$ is determined by Eq. (5).

$$L_{23} > \sqrt{2 \times \epsilon_{si} \times V_s/(q \times N_d)} \quad (5)$$

Then, the distance L23 is set so as to be larger than the thickness of the first layer 11. Since the depletion layer extends into the poly-silicon layer 22 before the avalanche breakdown occurs thereby, the same withstand voltage can be secured even if the first layer 11 is set thinner, so the integration density is further improved. Although the magnitude of the voltage is not restricted if only the voltage applied to the auxiliary electrode 33 has such polarity as inversely biases the pn junction J, the applied voltage is preferably set close to the rated voltage in order to fully extend the depletion layer into the polysilicon layer 22.

(Embodiment 2)

Figure 2:
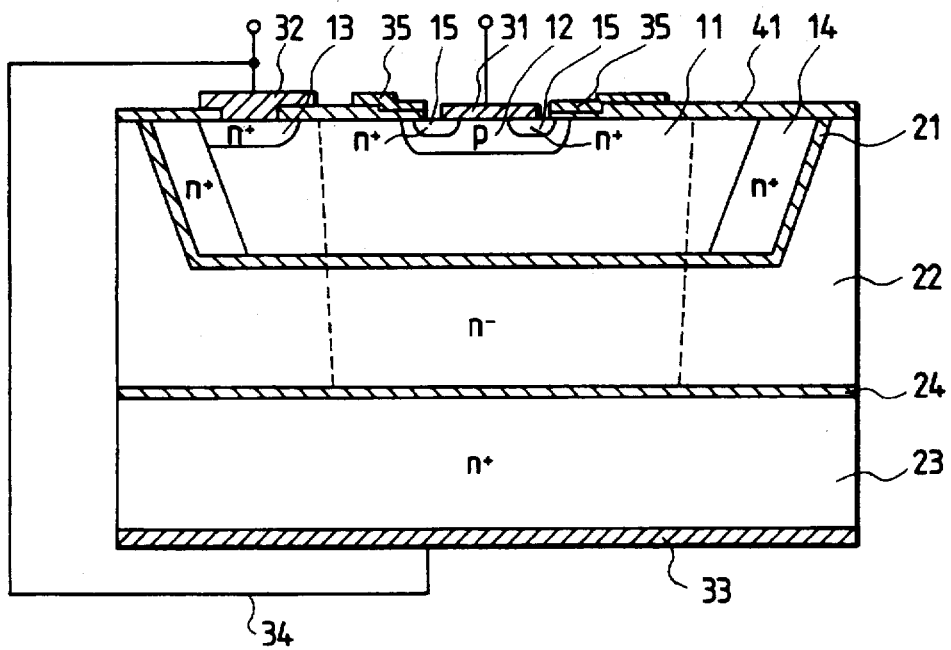
FIG. 2 is a sectional outline drawing showing the second embodiment of the semiconductor integrated circuit apparatus of the present invention.

FIG. 2 is a sectional outline drawing showing embodiment 2 of the SIC apparatus by the present invention. The embodiment 2 is different from the embodiment 1 in that the semiconductor element formed at the island 1 is a MOSFET (Metal Oxide Semiconductor Field Effect Transistor). In accordance with this, a fourth n type layer 14 having higher impurity concentration than the first layer 11 is formed between the first layer 11 and the silicon oxide film 21 at the side of the island 1, and a silicon oxide film 24 is provided between the poly-silicon layer 22 and the semiconductor substrate 23.

In the figure, reference numeral 15 designates a fifth n type layer having higher impurity concentration than the second layer 12, which fifth layer has the role of a source formed in the second layer 12. Numeral 35 designates a gate electrode of poly-silicon provided on a insulating film 41 formed on the second layer 12 between the first layer 11 and the fifth layer 15. The gate electrode 35 extends on the insulating film 41 formed on the first layer 11 in the lateral direction and has the role of a field plate for relaxing the formed high intensity field. The part of the insulating film 41 to which the second layer 12 is contacted is made thinner than the other part. The first main electrode 31 is ohmicly contacted to the second layer 12 and the fifth layer 15. The second main electrode 32 extends on the insulating film 41 formed on the first layer 11 in the lateral direction and has the role of suppressing the peak of the potential strength induced by the depletion layer extending from the side of the second layer 12 and reaching the third layer 13. In the embodiment, the flow of transient current by voltage changes into the semiconductor substrate 23 is obstructed by the silicon oxide film 24 between the poly-silicon layer 22 and the semiconductor substrate 23. A higher withstand voltage than the embodiment shown in FIG. 1 is realized in the present embodiment since the oxide film 21 also shares the applied voltage. Since the fourth n type layer 14 is formed between the first layer 11 and the silicon oxide film 21 in the side direction of the island 1, the depletion layer extending in the lateral direction is stopped by the fourth layer 14, and the depletion layers extending from the adjoining islands are prevented from joining together and interfering with each other in the poly-silicon layer 22 thereby.

Figure 3:
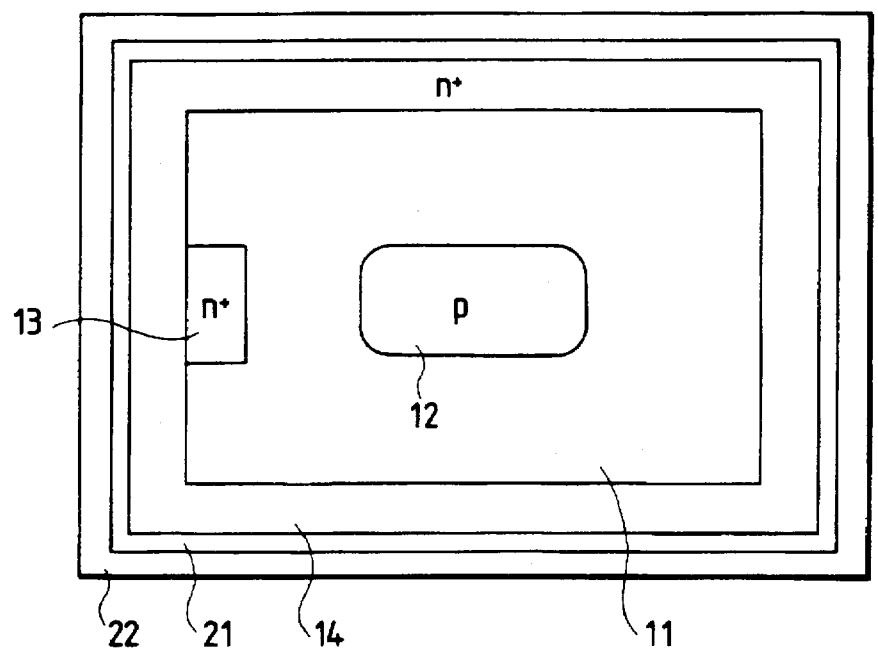
FIG. 3 is a plane view drawing of the semiconductor integrated circuit apparatus of the present invention shown in FIG. 2.

FIG. 3 is a plane drawing of the apparatus shown in FIG. 2. In the figure, the fifth layer 15, the gate electrode 35 and the first electrode 31 are omitted. The fourth layer 14 is formed to be along the inside face of the silicon oxide layer 21. Thereby, interference with other element is prevented even if a lead is drawn in any direction. And the third layer 13 is formed partially contacting to the fourth layer 14. Since the carriers are gathered from the fourth layer 14 thereby, the on-resistance can be reduced. Further, a lead can be drawn from the part of the fourth layer without the third layer 13 since the third layer 13 is formed along only a partial portion of the fourth layer 14.

(Embodiment 3)

Figure 4:
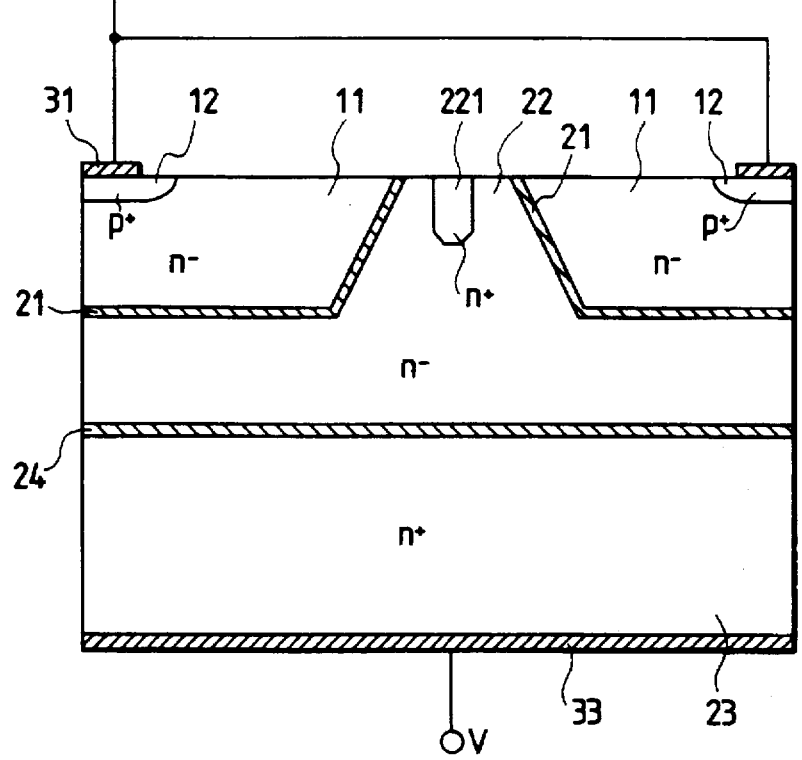
FIG. 4 is a sectional outline drawing showing the third embodiment of the semiconductor integrated circuit apparatus of the present invention.

FIG. 4 is a sectional outline drawing showing embodiment 3 of the present invention. A high impurity concentration region 221 is provided inside from the surface of the poly-silicon layer 22 between the adjoining islands respectively separated by the silicon oxide films 21. Since the extension of the depletion layer in the lateral direction is stopped by the region 221, the mutual interference of the adjoining islands 1 is prevented without lengthening the interval between the islands 1. It is desirable that the region 221 does not contact the silicon oxide film 21 and is provided apart from it. The reason is because the distance between the second layer 12 and the silicon oxide film 21 can be reduced due to the share of the applied voltage in the lateral direction by the first layer 11, the silicon oxide film 21 and the polysilicon layer 22 into which the depletion layer extends also. Therefore, the same withstand voltage as obtained by the embodiment described in FIG. 3 is secured without forming the fourth layer 14 shown in FIG. 3, although the withstand voltage is improved if the fourth layer 14 is also provided.

(Embodiment 4)

Figure 5:
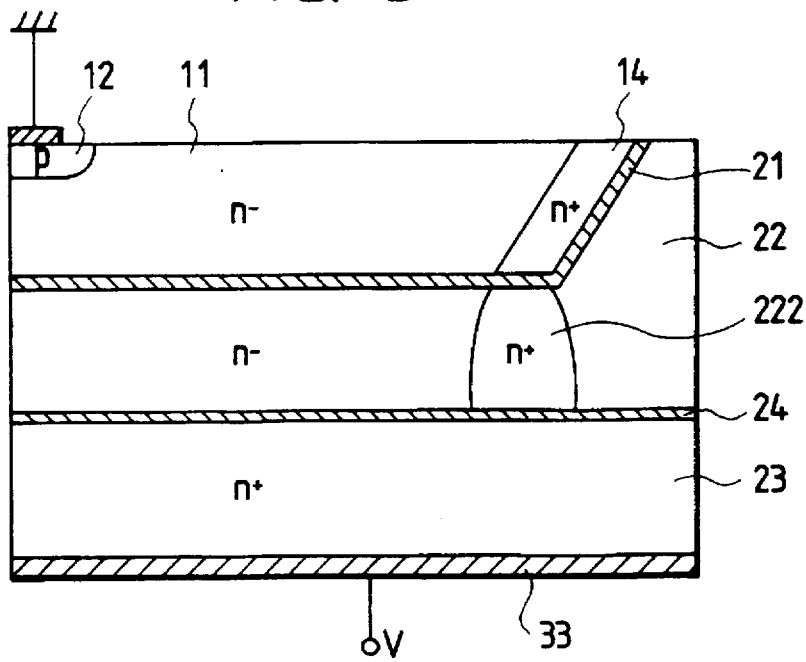
FIG. 5 is a sectional outline drawing showing the fourth embodiment of the semiconductor integrated circuit apparatus of the present invention.

FIG. 5 is a sectional outline drawing showing the fourth embodiment. In this embodiment, the high impurity concentration region 222 is formed between the silicon oxide films 21 and 24. Since the extension of the depletion layer in the lateral direction is stopped by the region 222 and the mutual interference of the adjoining islands 1 is prevented, the region for separating the islands 11 can be further narrowed.

(Embodiment 5)

Figure 6:
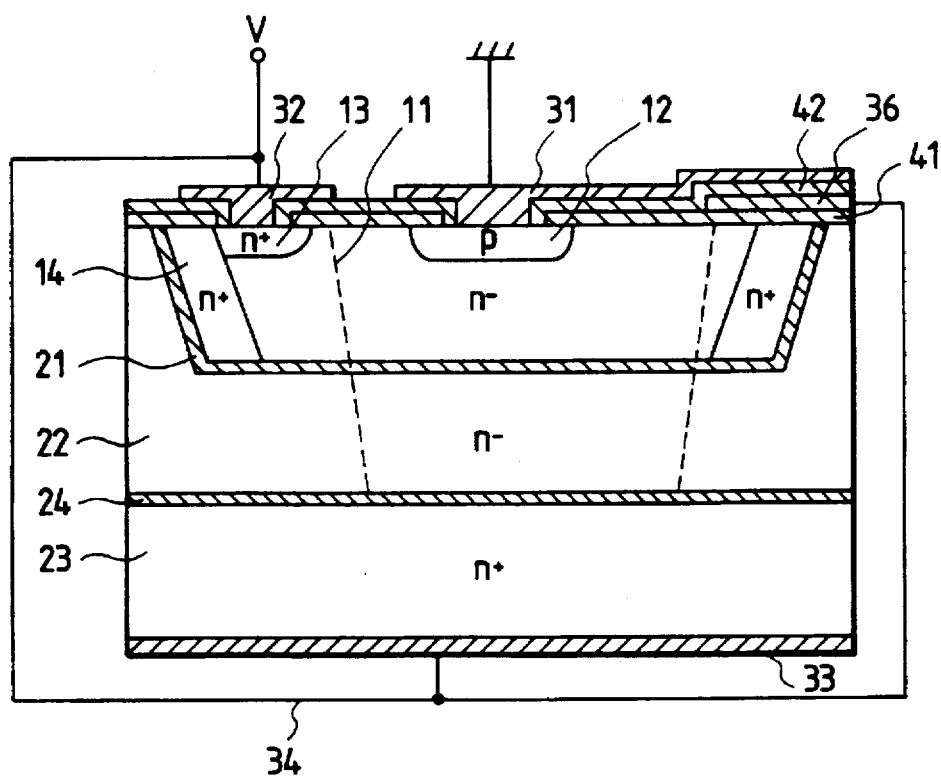
FIG. 6 is a sectional outline drawing showing the fifth embodiment of the semiconductor integrated circuit apparatus of the present invention.

FIG. 6 is a sectional outline drawing of the fifth embodiment in which the present invention is applied to a diode. In this embodiment, the third electrode 36 having the same potential as the second electrode 32 is newly provided on the insulating film 41 at the circumference of the island 1. The extending region of the depletion layer is indicated by dotted lines. The third electrode 36 is provided so as to reach a part above the first layer 11 as well as passing over the fourth layer 14 and the silicon oxide film 21. Poly-silicon is desirable as the material for the third electrode 36. The first electrode 31 is drawn into regions besides the island 1, insulated from the third electrode 36 by the insulating film 42. As for the bias state of each electrode, the first electrode 31 is grounded and the positive potential is applied to the second electrode 32, the auxiliary electrode 33 and the third electrode 36.

The above-mentioned constitution brings about the following effects. The depletion layer has the trend of extending in the lateral direction and reaches the fourth layer 14 by lower voltage since the depletion layer is extended in the lateral direction by the potential of the first electrode 31 near the surface of the first layer 11 in the region from which the first electrode 31 is drawn. When the depletion layer reaches the fourth layer 14 and can not extend further in the lateral direction, the potential centralizes at the surface of the boundary of the first layer 11 and the fourth layer 14, which decreases the withstand voltage.

One method for preventing the withstand voltage decrease is to relax the centralized potential between the first electrode 31 and the first layer 11 by increasing the thickness of the insulating films 41 and 42 under the first electrode 31. However, this method has the problem that, by increasing of the differences in level, the resolution of an aligner deteriorates and the producing accuracy by a photoresist also deteriorates, which consequently lowers the integration density. Since the third electrode 36 is provided and the positive potential is applied to it by the second electrode 32 in the present embodiment, the depletion layer extension in the lateral direction to the second electrode 32 is suppressed by the third electrode 36. Then, the depletion layer is extended in the perpendicular direction and the potential centralization in the lateral direction is relaxed, which consequently improves the withstand voltage. The thickness of the insulating film 41 between the third electrode 36 and the fourth layer 14 can be decreased due to the suppression of the potential centralization on the fourth layer 14 by the potential relaxation in the lateral direction, which consequently improves the producing accuracy by a photo resist and increases the integration density. In the prior art devices, about 6 μm is required as the thickness of the insulating film 41 to obtain the desired 700 V withstand voltage. On the other hand, the thickness of the insulating film 41 can be reduced to 2.5 μm and the minimum producing size is improved by 3 μm by the present embodiment.

Figure 7:
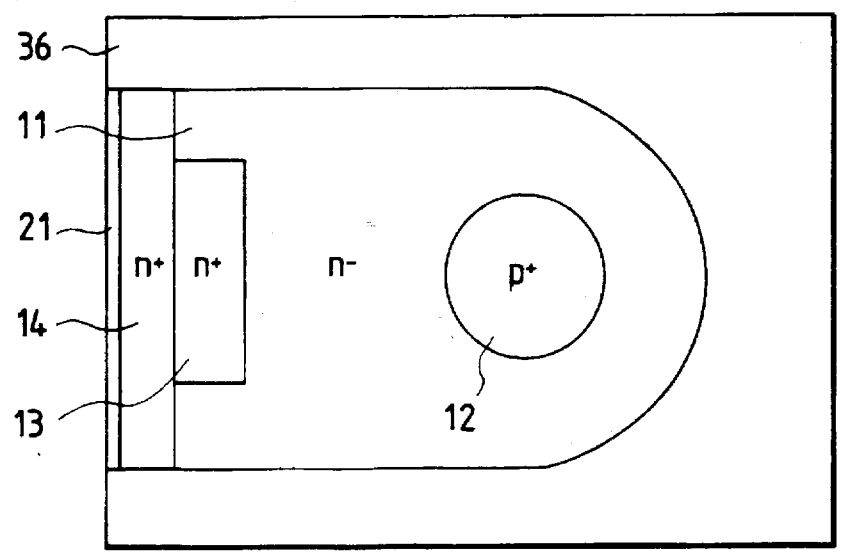
FIG. 7 is a plane view drawing of the semiconductor integrated circuit apparatus of the present invention shown in FIG. 6.

FIG. 7 is a plane drawing of the embodiment shown by FIG. 6. The third electrode 36 is provided at the circumference of the island 1 except the vicinity of the region where the third layer 13 is formed. The first electrode 31 can be drawn from the second layer 12 in any direction except the direction to the third layer 13, which increases the layout freedom of a SIC apparatus.

(Embodiment 7)

Figure 8:
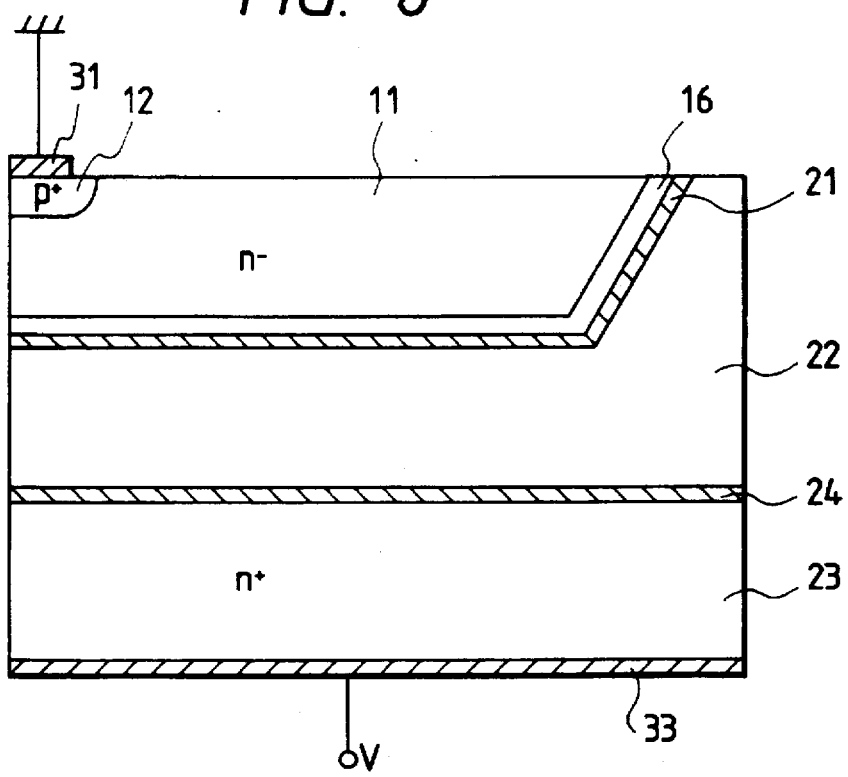
FIG. 8 is a sectional outline drawing showing the sixth embodiment of the semiconductor integrated circuit apparatus of the present invention.

FIG. 8 is a sectional outline drawing showing the seventh embodiment of the present invention. In this embodiment, the sixth n type layer 16 having higher impurity concentration than the first layer 11 is formed along with the whole boundary face of the first layer 11 and the silicon oxide film 21. The thickness and the impurity concentration of the sixth layer 16 are determined so that the depletion layer reaches the silicon oxide film 21 by lower voltage than that at which the avalanche breakdown occurs. In this embodiment, the shared potential by the island 1 covered with the silicon oxide film 21, namely, the shared potential by the first layer 11 and the sixth layer 16, has a higher ratio of the applied voltage compared with the shared voltage by the island 1 without the sixth layer 16 since the impurity density is higher than the first layer 11. Thereby, the voltage applied to the silicon oxide films 21 and 24 and the poly-silicon layer 22 is suppressed, and the thickness of the silicon oxide films 21 and 24 and the poly-silicon layer 22 can be reduced.

(Embodiment 8)

Figure 9:
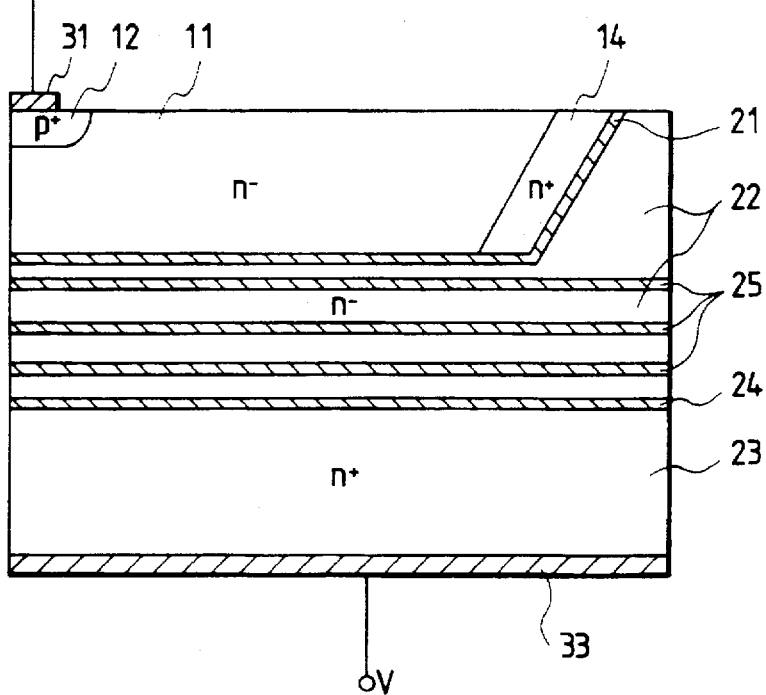
FIG. 9 is a sectional outline drawing showing the seventh embodiment of the semiconductor integrated circuit apparatus of the present invention.

FIG. 9 is a sectional outline drawing showing the eighth embodiment of the present invention. In this embodiment, three layers of the silicon oxide films 25 are stratiformly scattered in the poly-silicon layer 22. By the above-mentioned constitution, five layers of silicon oxide films exist in the apparatus, therefore, the voltage applied to any one layer is decreased, and the thickness of each silicon oxide film and poly-silicon layer is reduced, which shortens the producing time and makes the producing process easier.

(Embodiment 9)

Figure 10:
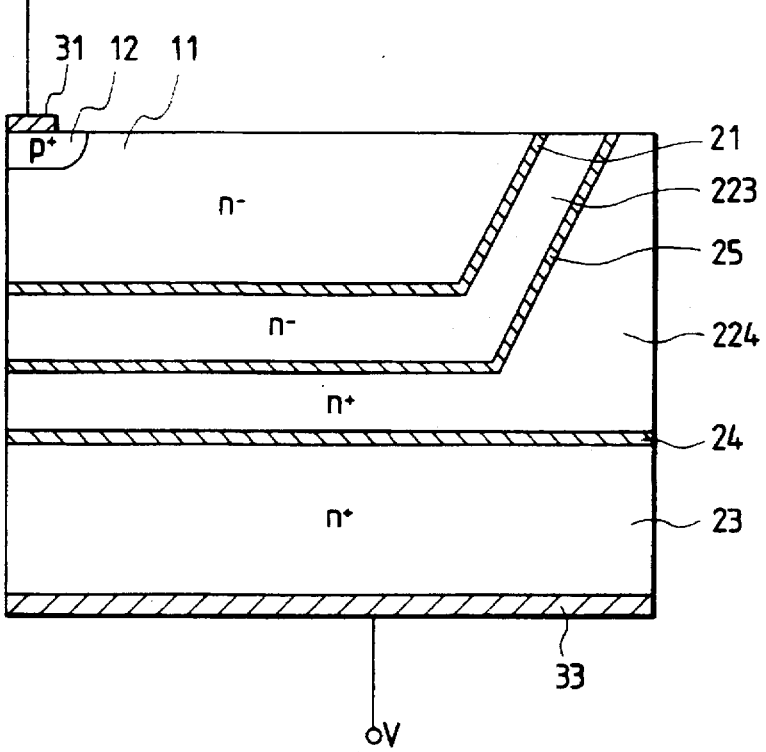
FIG. 10 is a sectional outline drawing showing the eighth embodiment of the semiconductor integrated circuit apparatus of the present invention.

FIG. 10 is a sectional outline drawing showing the ninth embodiment by the present invention. In this embodiment, a layer of the silicon oxide film 25 is provided in the poly-silicon layer 22, surrounding the island 1 and its brim reaches the surface of the island 1. The poly-silicon layer 22 is divided into two parts by the silicon oxide film 25, and the island 1 side layer 223 has a lower impurity concentration than the semiconductor substrate 23 side layer 224. By the above-mentioned constitution, the depletion layer extends into the low impurity concentration layer 223 in both the lateral and the perpendicular direction, and is stopped by the high impurity concentration layer 224. Thereby, the voltage applied to the first layer 11 is lower than the applied voltage and the lateral distance between the second layer 12 and the silicon oxide layer 21 can be reduced, which improves the integration density, since the applied voltage is shared by the silicon oxide film 21, the layer 223 of the poly-silicon layer 22 and the silicon oxide film 25 in the lateral direction as well as in the perpendicular direction. And the lateral extension of the depletion layer is prevented by the layer 224 of the poly-silicon layer 22 and the separation region among the islands 1 is narrowed, which improves the integration density further.

(Embodiment 10)

Figure 11:
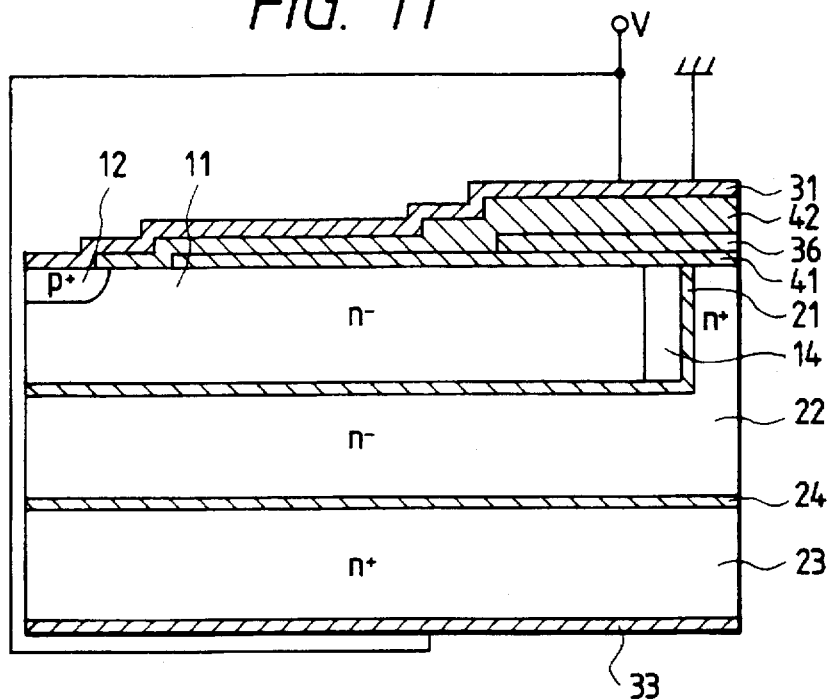
FIG. 11 is a sectional outline drawing showing the ninth embodiment of the semiconductor integrated circuit apparatus of the present invention.

FIG. 11 is a sectional outline drawing showing the tenth embodiment by the present invention. This embodiment has the constitution wherein the side wall of the island 1 meets at right angles to the exposed surface. The constitution is realized by processing the side wall of the island 1 with anisotropic dry etching. By this constitution, the separation region between the islands 1 is reduced. Although dry etching has a drawback of requiring a long processing time, the dry etching processing is applicable to the present embodiment due to the thin thickness of the first layer 11, thereby, high integration density is realized.

(Embodiment 11)

Figure 12:
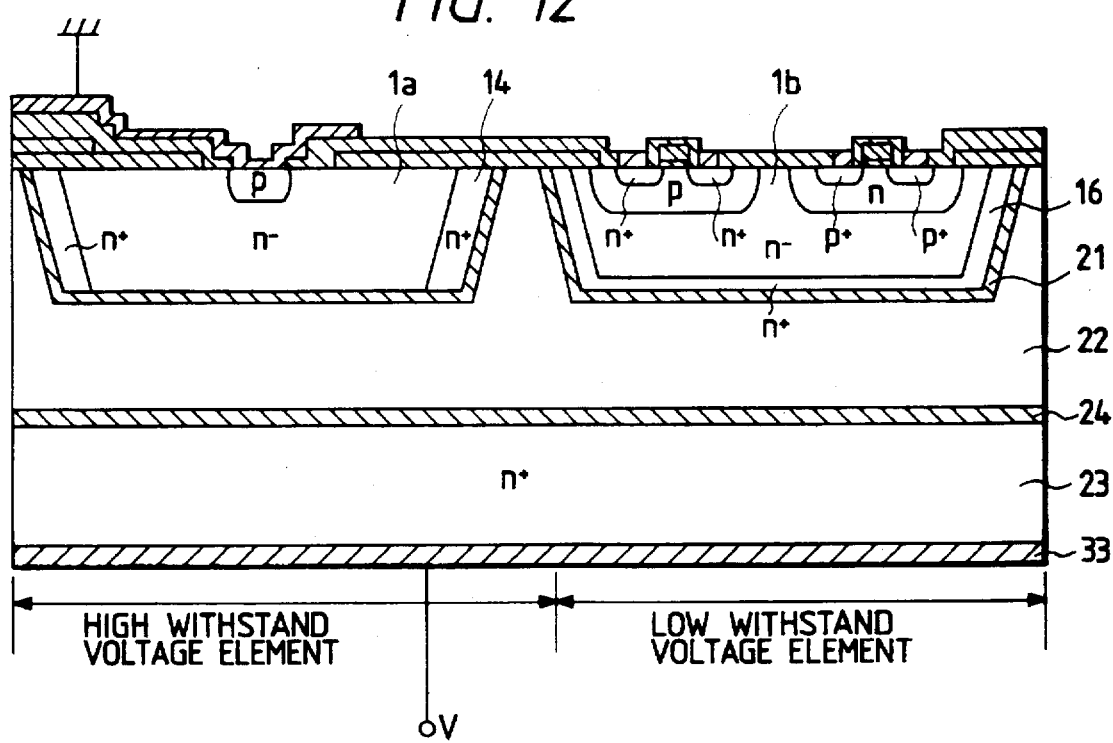
FIG. 12 is a sectional outline drawing showing the tenth embodiment of the semiconductor integrated circuit apparatus of the present invention.

FIG. 12 is a sectional outline drawing showing the eleventh embodiment by the present invention. This embodiment presents the SIC apparatus having a dielectric separation substrate on which both a high withstand voltage element and low withstand voltage elements are formed. A high withstand voltage element is formed in a island 1a and plural low withstand voltage elements are formed in island 1b. The fourth layer 14 is formed along with the side wall of the island 1a in which a high withstand voltage element is provided, and the sixth layer 16 is formed along with the whole face of the silicon oxide film 21 of the island 1b in which plural low withstand voltage elements are provided. In the island 1b, high integration density is realized since the separation regions can be further narrowed due to separation of the low withstand voltage elements by the pn junctions when compared with a method for forming an element in an island by dielectric separation.

Figure 13:
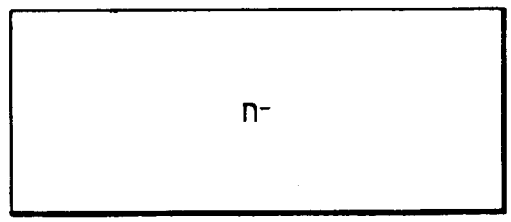
FIG. 13(1) to 13(6) show a producing method of the dielectric separation substrate used to the semiconductor integrated circuit apparatus of the present invention.
Figure 13:
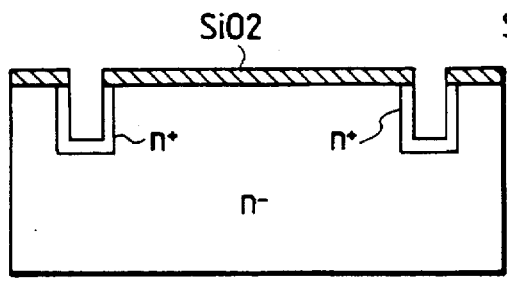
Figure 13:
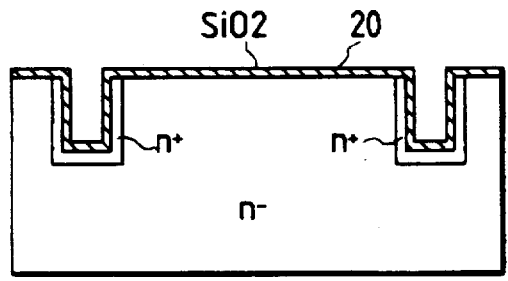
Figure 13:
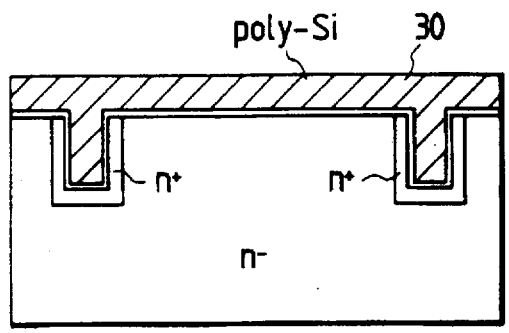
Figure 13:
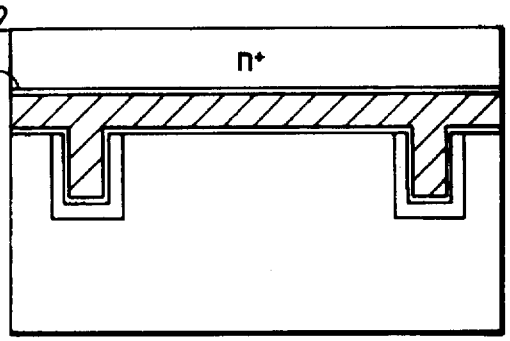
Figure 13:
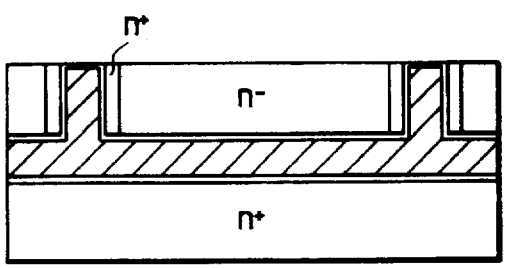

FIGS. 13(1)–13(6) show a outline process diagram showing an example production method of the dielectric separation substrate used for the SIC apparatus of the present invention. The process comprises the steps of:

{1} preparing an n type semiconductor wafer,

{2} forming selectively a silicon oxide film, making grooves by etching, preferably with KOH anisotropic etching or dry etching, a surface of the semiconductor wafer on which the silicon oxide film is masked, and forming n type layers by doping phosphorus or arsenic into the surfaces of the grooves at the semiconductor wafer utilizing the silicon oxide film as masks, {3} removing the silicon oxide film from the surface of the semiconductor wafer, and forming a silicon oxide film on the whole face of the wafer, including the surfaces of the grooves, {4} accumulating a poly-silicon layer on the silicon oxide layer so as to fully bury the grooves, and grinding the surface of the poly-silicon layer, {5} affixing the silicon substrate having a silicon oxide film thereon to the poly-silicon layer, by facing its silicon oxide film surface to the poly-silicon layer, and {6} scraping the other surface of the semiconductor wafer until the grooves are exposed at the surface of the wafer. By the above-mentioned process, the dielectric separation substrate used for the present invention is produced.

(Embodiment 12)

Figure 14:
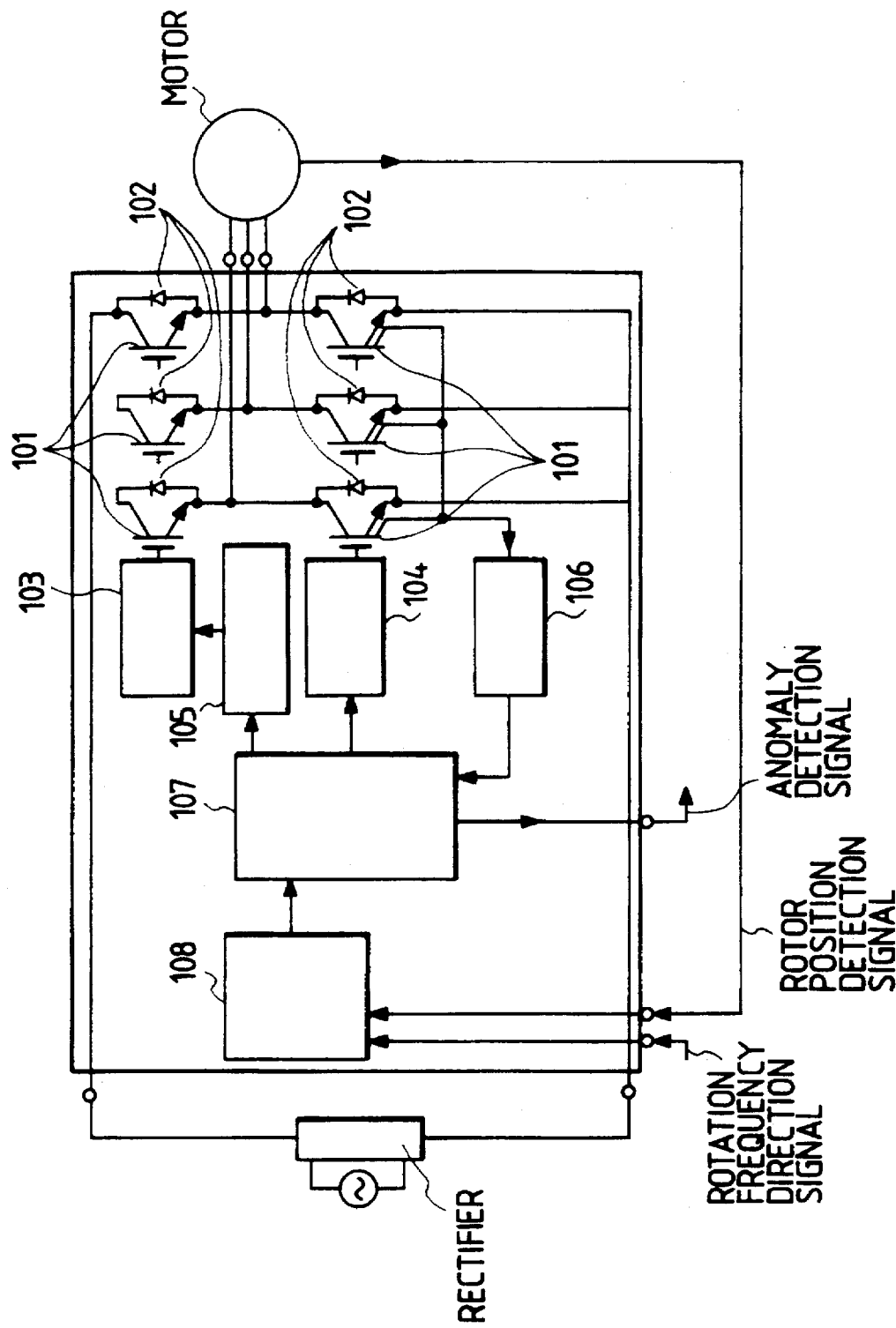
FIG. 14 is an outline drawing showing an example of the monolithic inverter IC using the semiconductor integrated circuit apparatus of the present invention.

FIG. 14 is an outline drawing showing the twelfth embodiment wherein the SIC apparatus of the present invention is applied to a monolithic inverter IC. The SIC is an inverter for generating a three phase alternating current power by inputting a direct current obtained with a rectified alternating current and comprises six power switching elements 101 at the output stage, six diodes 102 connected thereto in an inversely parallel relationship, an upper arm driving circuit 103 and a lower arm driving circuit 104 for driving the power switching elements of an upper arm and a lower arm, respectively, a level shift circuit 105 for transmitting signals from elements having low potentials to the upper arm driving circuit 103 having a high potential, a current detection circuit 106 for detecting currents flowing in the power switching elements, a logic circuit 107 for generating driving signals and a rotation frequency control circuit 108 for controlling the rotation frequency accepting a rotor position detection signal and a rotation direction signal from the outside. In the case of dealing with large currents, it is difficult to integrate all elements in a dielectric separation substrate, so it is practical to integrate the power switching elements 101 and the diodes 102 connected thereto in the different dielectric substrates, respectively, or to use elements separately.

(Embodiment 13)

Figure 15:
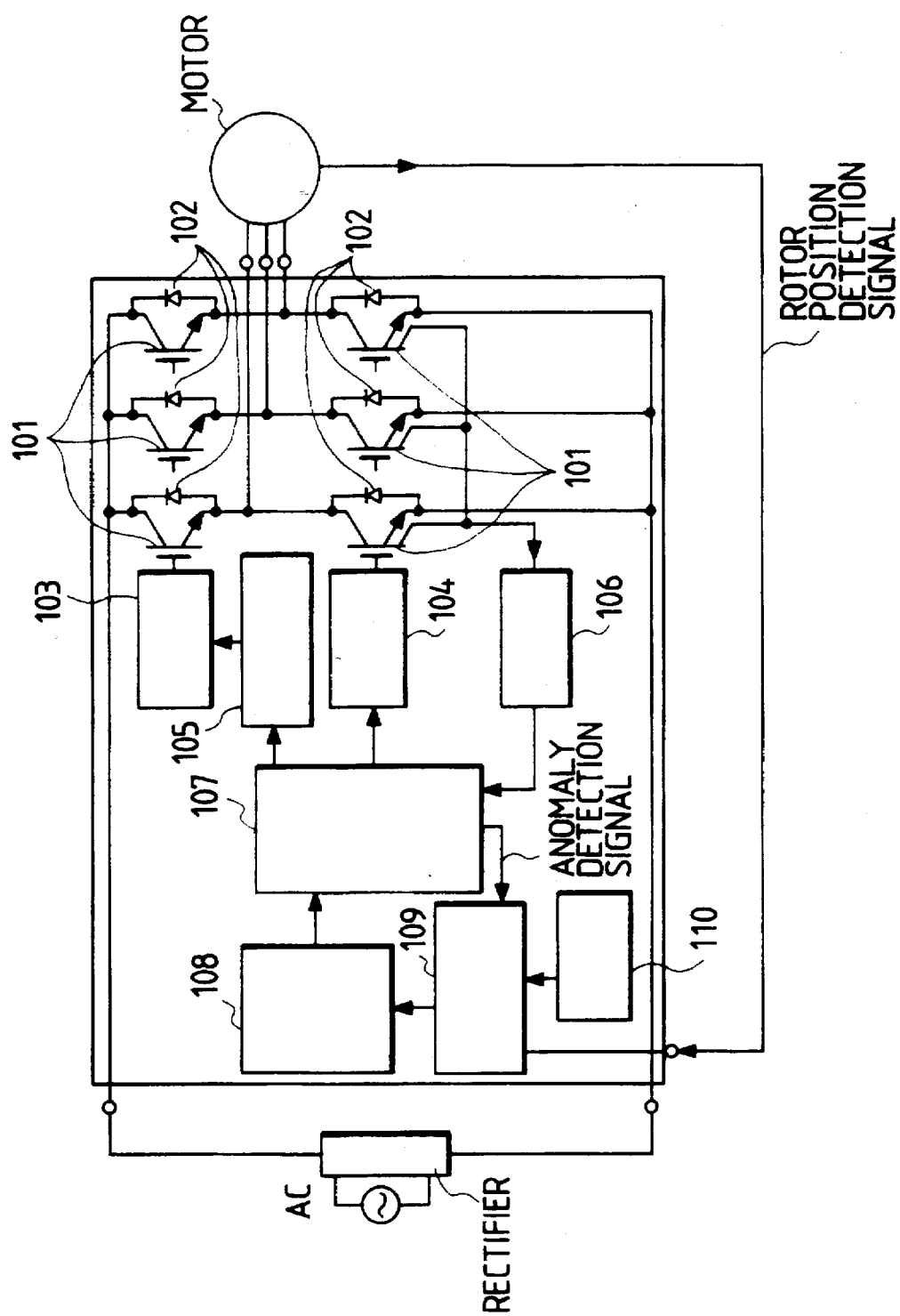
FIG. 15 is an outline drawing showing another example of the monolithic inverter IC using the semiconductor integrated circuit apparatus of the present invention.

FIG. 15 is an outline drawing showing the thirteenth embodiment wherein the SIC apparatus of the present invention is applied to a monolithic inverter IC. Since a fine producing process is adoptable to the dielectric separation substrate used in the present invention as mentioned above, this makes it possible to integrate a micro-processor, a digital signal processor (DSP), or memories. In the SIC of the present embodiment, the microprocessor or the DSP is integrated in the substrate and a motor is controlled by a program stored in the memories 110. The inverter circuit can be provided inside a motor due to downsizing of the inverter.

Figure 16:
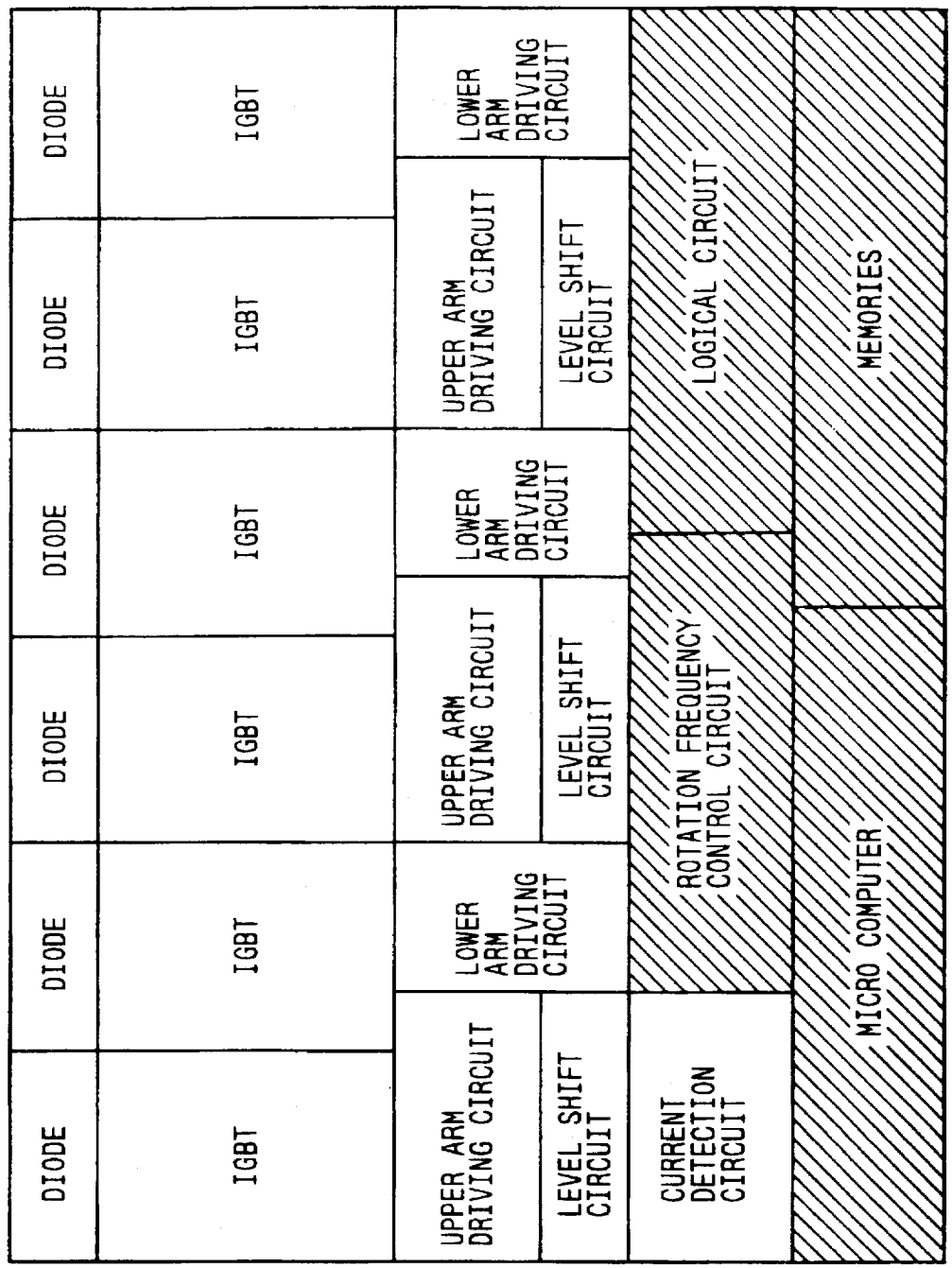
FIG. 16 is a layout figure of the monolithic inverter IC shown by FIGS. 14 and 15.

FIG. 16 is a plane layout outline drawing showing the monolithic inverter IC described in FIGS. 14 and 15. As mentioned in the embodiment 11, a high withstand voltage element is formed in an island and plural low withstand voltage elements are formed in a island. In the figure, plural elements are integrated in an island at the region indicated by oblique lines, which improves the integration density since the plural low withstand voltage elements bring about narrow separation regions. The present invention is more effective to the apparatus having the higher ratio of the separation region to the active region in which currents flow. And the apparatus having elements requiring high withstand voltages gains larger effectiveness by the present invention since an element requiring a high withstand voltage needs a large separation region. Therefore, the present invention is particularly effective to the circuit regions except the IGBT (Insulated Gate Bipolar Transistor)s having large active regions and the diode connected thereto. If the withstand voltage is 700 V, the separation region is required to be 64 µm as explained in the embodiment 1, and the minimum producing size is 10 µm as explained in the embodiment 5, in a SIC apparatus using the prior art structure. The 20 µm size of the separation region and the 3 µm producing size are realized by the present invention. Thereby, the area of a SIC including about 1000 elements can be reduced to 20 mm$^2$, that is, to about ⅓ of the existing one having an area of 50 mm$^2$.

Figure 17:
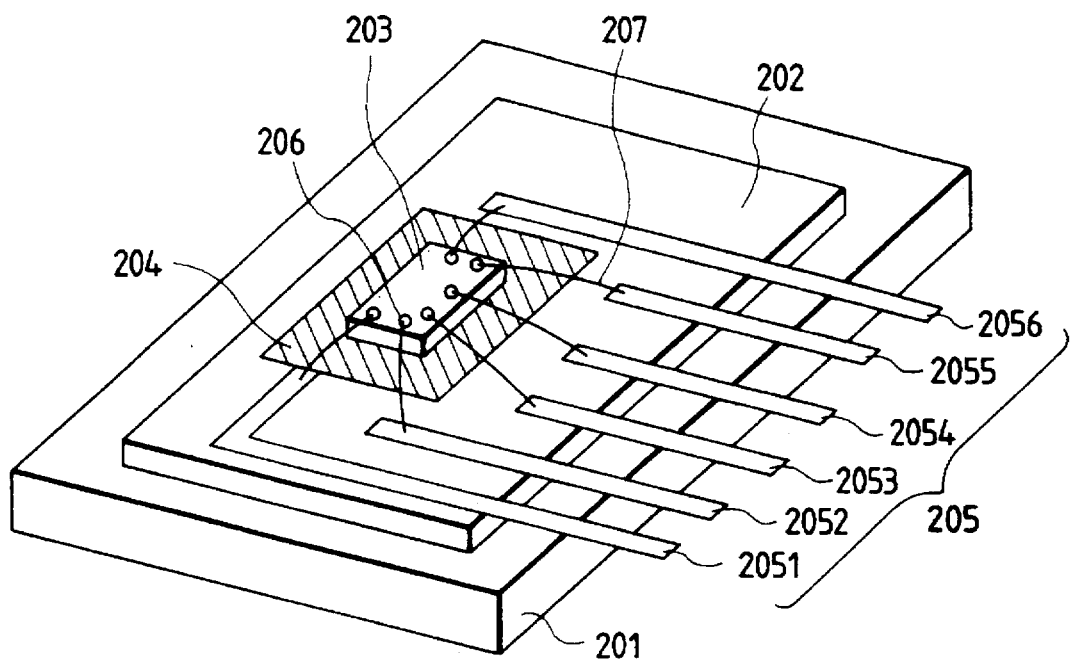
FIG. 17 is a perspective outline figure showing the method for putting the semiconductor integrated circuit of the present invention into a package.
Figure 18:
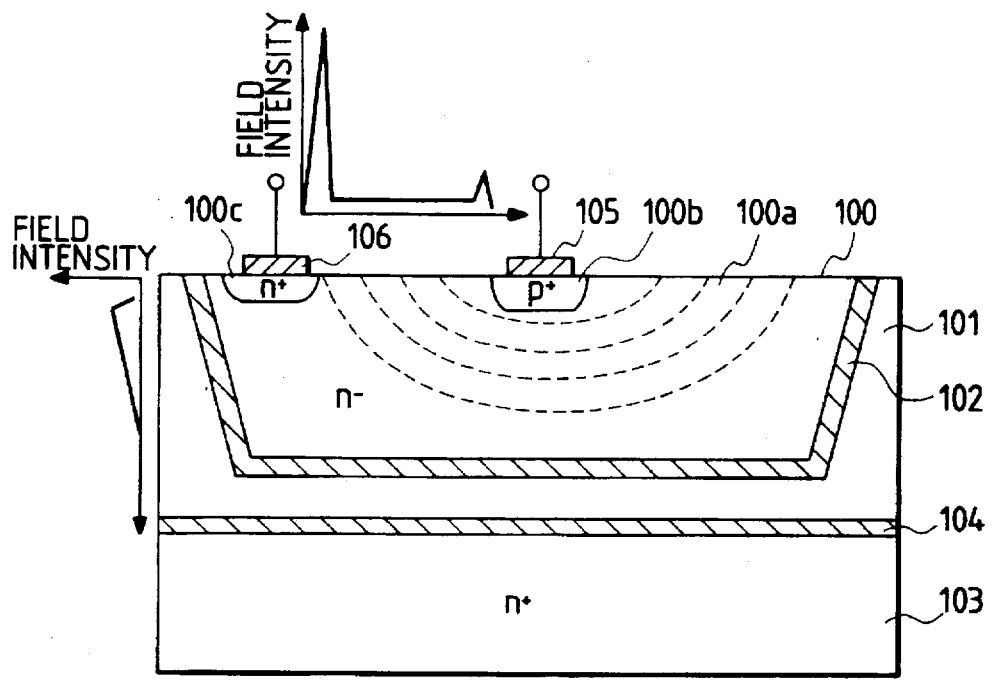
FIG. 18 is a sectional outline drawing showing an existing semiconductor integrated circuit apparatus.

By referring to FIG. 17, a method for providing the SIC apparatus into a package is explained. FIG. 17 is a perspective drawing of the SIC apparatus of the present invention mounted in a package. The SIC apparatus of the present invention mounted in a package is covered with a protection film such as resin. The SIC chip 203 is mounted on a radiation plate with a metal layer 204 therebetween, and plural lead terminals 205 (2051–2056) are provided on the plate. The chip 203 is electrically connected to outer circuits through which signal exchanging or power supplying are done. The chip 203 is connected to the lead terminals 205 by bonding wires 207 made from gold or aluminum linked between wiring pads 206 and the lead terminals 205. The lead terminals 205 are connected to the highest potential power source and the metal layer 204. Thereby, the supporter 2 (not shown in the figure) of the chip 203 is connected to the highest potential power source, and the reverse bias potential is applied to the pn junction formed in the first layer 11 (not shown in the figure).

Since the supporter 2 is electrically connected to the highest potential lead terminal as mentioned above, the chip does not have to be connected to the high potential power source outside the package. And, even if the back face of the chip has high potential, the radiation plate 201 is kept at low potential since the lead terminals 205 are provided at the insulating substrate mounted on the radiation plate 201. Therefore, an electric shock can be prevented if the radiation plate 201 is attached to a wall of the equipment containing the apparatus.

Since the chip 203 thermally conducts to the radiation plate 201 through the metal layer 204 and the insulating substrate 202, low thermal resistance material, especially nitric aluminum, is desirably used to the insulating substrate 202. Exchanging the n type semiconductor for the p type one in the above-mentioned embodiments also brings about the similar effects as the above-mentioned embodiments. Although the applications to a diode and a MOSFET are described in the embodiments, the applications of the present invention are not restricted to those ones and the present invention is applicable to all types of elements having pn junctions.

The effectiveness of the present invention is briefly mentioned in the following discussion.

In a dielectric separation substrate comprising first plural island-wise semiconductor layers of a first type conductivity, semiconductor layers of a second type conductivity formed in the first semiconductor layers, first insulating films for surrounding the first semiconductor layers and separating the island elements, a semiconductor substrate for a supporter having high impurity concentration, a second insulating film formed on the semiconductor substrate and a poly-silicon layer formed between the first insulating films and the second insulating film, the first semiconductor layer between the bottoms of the second semiconductors layer and the first insulating films can be fully depleted by lower voltage than that at which the avalanche breakdown occurs in the first semiconductor layer, by adequately setting the impurity concentration of the first semiconductor layer and the distance between the bottoms of the second semiconductor layers. The voltage applied to the first semiconductor layer is lower than the applied voltage since the applied voltage is shared by the first insulating films, the high impurity density semiconductor substrate for the supporter, the second insulating film formed on the semiconductor substrate and the poly-silicon layer. The thickness of the semiconductor layers forming the elements can be thinner by the above-mentioned constitution, which makes the area of the element separating regions more narrow, improves the integration density and brings on about an easier producing process. The extension of the depletion layer is stopped at the surface of the high impurity density semiconductor substrate, and each depletion layer of the elements can be prevented from joining in the substrate and interfering with each other. And the contact resistances to electrodes can be also reduced.

What is claimed is:

1. A dielectric isolated high voltage semiconductor device having a supporter including stacked layers of a first semiconductor layer of a first conductivity type and a second semiconductor layer with a higher impurity concentration than said first semiconductor layer, a first insulating film interposed between said second semiconductor layer and said first semiconductor layer, and at least one semiconductor island which is buried in said first semiconductor layer so as to have a surface exposed outside of said semiconductor device, in which a second insulating film is interposed between said at least one semiconductor island and said first semiconductor layer, and surrounding said at least one semiconductor island, wherein said at least one semiconductor island comprises a first island layer of said first conductivity type, a second island layer of a second conductivity type with a higher impurity concentration than said first island layer, said second island layer extending into said first island layer from a surface of said at least one island, a third island layer of said first conductivity type with a higher impurity concentration than said first island layer, extending into said first island layer from a surface of said at least one island at a place apart from said second island layer, and a first electrode and a second electrode provided at said second island layer and said third island layer, respectively, wherein a fourth island layer of said first conductivity type with a higher impurity concentration than said first island layer is provided at an inside sidewall surface of said second insulating film surrounding said at least one semiconductor island.

2. A dielectric isolated high voltage semiconductor device according to claim 1, wherein an auxiliary electrode is arranged to receive a potential for reversely biasing a main junction of a circuit element formed in said at least one island.

3. A dielectric isolated high voltage semiconductor device according to claim 2, wherein said island has a predetermined depth such that a depletion layer, formed by reversely biasing the main junction of the circuit element, reaches said first semiconductor layer of said supporter.

4. A dielectric isolated high voltage semiconductor device having a supporter including stacked layers of a first semiconductor layer of a first conductivity type and a second semiconductor layer with a higher impurity concentration than said first semiconductor layer, a first insulating film interposed between said second semiconductor layer and said first semiconductor layer, and at least one semiconductor island which is buried in said first semiconductor layer so as to have a surface exposed outside of said semiconductor device, in which a second insulating film is interposed between said at least one semiconductor island and said first semiconductor layer, and surrounding said at least one semiconductor island, wherein said at least one island comprises a first island layer of said first conductivity type, a second island layer of a second conductivity type with a higher impurity concentration than said first island layer, said second island layer extending into said first island layer from a surface of said at least one island, a third island layer of said first conductivity type with a higher impurity concentration than said first island layer, extending into said first island layer from a surface of said at least one island at a place apart from said second island layer, and a first electrode and a second electrode provided at. said second island layer and said third island layer, respectively, and wherein a third electrode is provided at said second semiconductor layer, and said second electrode and said third electrode are shorted.

5. A dielectric isolated high voltage semiconductor device according to claim 4, wherein a fourth island layer of said first conductivity type with a higher impurity concentration than said first island layer is provided at an inside sidewall surface of said second insulating film surrounding said at least one semiconductor island.

6. A dielectric isolated high voltage semiconductor device having a supporter including stacked layers of a first semiconductor layer of a first conductivity type and a second semiconductor layer with a higher impurity concentration than said first semiconductor layer, a first insulating film interposed between said second semiconductor layer and said first semiconductor layer, and at least one semiconductor island which is buried in said first semiconductor layer so as to have a surface exposed outside of said semiconductor device, in which a second insulating film is interposed between said at least one semiconductor island and said first semiconductor layer, and surrounding said at least one semiconductor island, wherein said at least one island comprises a first island layer of said first conductivity type, a second island layer of a second conductivity type with a higher impurity concentration than said first island layer, extending into said first island layer from a surface of said at least one island, a third island layer of said first conductivity type with a higher impurity concentration than said first island layer, extending into said first island layer from a surface of said at least one island at a place apart from said second island layer, and a first electrode and a second electrode provided at said second island layer and said third island layer, respectively, and wherein said at least one island has a predetermined depth such that a depletion layer, formed by reversely biasing a junction between said first island layer and said second island layer, reaches said first semiconductor layer.

7. A dielectric isolated high voltage semiconductor device having a supporter including stacked layers of a polysilicon semiconductor layer of a first conductivity type and a semiconductor substrate with a higher impurity concentration than said polysilicon semiconductor layer, a first insulating film interposed between said semiconductor substrate and said polysilicon semiconductor layer, and at least one semiconductor island which is buried in said polysilicon semiconductor layer so as to have a surface exposed outside of said semiconductor device, in which a second insulating film is interposed between said at least one semiconductor island and said polysilicon semiconductor layer, and surrounding said at least one semiconductor island, wherein said at least one island comprises a first island layer of said first conductivity type, a second island layer of a second conductivity type with a higher impurity concentration than said first island layer, said second island layer extending into said first island layer from a surface of said at least one island, a third island layer of said first conductivity type with a higher impurity concentration than said first island layer, extending into said first island layer from a surface of said at least one island at a place apart from said second island layer, and a first electrode and a second electrode provided at said second island layer and said third island layer, respectively, and wherein an impurity concentration and a thickness of a region between a bottom of said island and a circuit element formed in said island are set so that said region is fully depleted by a lower voltage than a voltage at which an avalanche breakdown occurs in said island.

8. A dielectric isolated high voltage semiconductor device according to claim 7, wherein a fourth layer of said first conductivity type with a higher impurity concentration than said polysilicon semiconductor layer is provided at an inside sidewall surface of said second insulating film surrounding said at least one semiconductor island.

9. A dielectric isolated high voltage semiconductor device having a supporter including stacked layers of a polysilicon semiconductor layer of a first conductivity type and a semiconductor substrate with a higher impurity concentration than said polysilicon semiconductor layer, a first insulating film interposed between said semiconductor substrate and said polysilicon semiconductor layer, and at least one semiconductor island which is buried in said polysilicon semiconductor layer so as to have a surface exposed outside of said semiconductor device, in which a second insulating film is interposed between said at least one semiconductor island and said polysilicon semiconductor layer, and surround said at least one semiconductor island, wherein said at least one island comprises a first island layer of said first conductivity type, a second island layer of a second conductivity type with a higher impurity concentration than said first island layer, said second island layer extending into said first island layer from a surface of said at least one island, a third island layer of said first conductivity type with a higher impurity concentration than said first island layer, extending into said first island layer from a surface of said at least one island at a place apart from said second island layer, and a first electrode and a second electrode provided at said second island layer and said third island layer, respectively, and a third electrode provided at said second semiconductor layer, and wherein a distance between a bottom of said second island layer and said second insulating film can be less than $(1/14 \times V)$ μm, when a reverse bias of V volts is applied between said first and second electrodes.

* * * * *